United States Patent [19]

Hankland

[11] 4,407,685
[45] Oct. 4, 1983

[54] METALLIZED FILM TRANSFER PROCESS

[75] Inventor: Lawrence B. Hankland, Menlo Park, Calif.

[73] Assignee: Ford Aerospace & Communication Corporation, Detroit, Mich.

[21] Appl. No.: 260,229

[22] Filed: May 4, 1981

Related U.S. Application Data

[63] Continuation of Ser. No. 59,807, Jul. 23, 1979, abandoned.

[51] Int. Cl.$^3$ .......................... B31F 1/00; B44C 1/00; B29C 17/00; B32B 3/26
[52] U.S. Cl. ................................. 156/212; 156/224; 156/230; 156/233; 156/241; 156/245; 156/285; 156/307.7; 156/309.6; 156/344; 264/135
[58] Field of Search ............... 156/201, 245, 81, 206, 156/307.7, 309.6, 284, 382, 247, 241, 233, 230, 242, 285, 344, 331.1, 63, 182, 196, 212, 213, 215, 220, 224, 221, 229, 300, 289, 330; 264/134, 135, 511, 547, 553, 101, 571

[56] References Cited

U.S. PATENT DOCUMENTS

| | | | | |
|---|---|---|---|---|
| 3,575,772 | 4/1971 | Billings | ................................ | 156/233 |
| 3,657,044 | 4/1972 | Singer | ................................ | 156/382 |
| 3,839,129 | 10/1974 | Neumann | ................................ | 264/135 |
| 3,910,806 | 10/1975 | Schwartz | ................................ | 156/233 |
| 3,984,598 | 10/1976 | Sarazin et al. | ................................ | 156/233 |
| 3,990,924 | 11/1976 | Konicek | ................................ | 156/241 |
| 4,029,845 | 6/1977 | Nomura | ................................ | 156/241 |
| 4,083,205 | 4/1978 | Clarke et al. | ................................ | 156/382 |
| 4,105,734 | 8/1978 | Nakagawa | ................................ | 156/245 |
| 4,194,938 | 3/1980 | Figge et al. | ................................ | 156/224 |
| 4,231,830 | 11/1980 | Ryan et al. | ................................ | 156/233 |

OTHER PUBLICATIONS 79-00103, 3/79, Grimes, (PCT/US).

*Primary Examiner*—Edward C. Kimlin
*Assistant Examiner*—Louis Falasco
*Attorney, Agent, or Firm*—Edward J. Radlo; Robert D. Sanborn

[57] ABSTRACT

A release film is coated with a thin layer of metal by, for example, a vapor deposition process. The film is then stretched over a composite object, made, e.g., of fiberglass-epoxy or graphite-epoxy, which one desires to metallize. A treatment involving either vacuum or pressure and that may involve heat is used to transfer the thin metal layer to the composite object. The stretchable film is then peeled off the object, leaving a metal coating bonded to the object. The epoxy resin or other adhesive in the composite material gives structural integrity to the object as well as provides a bond for the metal, so that the composite object may be molded and metallized in one step. Alternatively, a two-step process of molding then metallizing or metallizing then molding can be employed.

1 Claim, 4 Drawing Figures

METALLIZED FILM TRANSFER PROCESS

This is a continuation of application Ser. No. 059,807 filed July 23, 1979 abandoned.

BACKGROUND OF THE INVENTION

1. Field of the Invention:

This invention is a method for adhering a thin metal layer to an object fabricated of a composite material such as fiberglass-epoxy or graphite-epoxy. The object can be molded and metallized in one step. Because the metallized layer can be made extremely thin, the method has particular applicability to the metallization of satellite parts.

2. Description of the Prior Art:

A prior art search has disclosed the following U.S. Pat. references:

U.S. Pat. No. 3,080,270 utilizes a separate and discrete adhesive layer between the metal and the fabric being coated. The present invention uses no such adhesive layer. The patent does not teach the coating of surfaces which are compoundly curved, i.e., have a curvature in more than one orthogonal direction. The present invention, on the other hand, is capable of coating an arbitrarily large object having an arbitrary shape. Finally, the patent teaches coating onto a surface which is not rigid, unlike in the present invention.

U.S. Pat. No. 3,240,647 also requires an adhesive layer. This patent teaches the placing of a foil onto a printed circuit board. One problem with foil is that it cannot be deformed as much as a metallized film. This limits its use to cover compoundly curved surfaces. Another problem with foil is that it is heavy. In the present invention, on the other hand, the metal layer can be made exceedingly thin, such as less than 0.0002 inches in thickness.

U.S. Pat. No. 3,340,121 also requires an adhesive layer. It does not teach a one step molding and metallization, an important feature of the present invention.

U.S. Pat. No. 3,410,744 also requires an adhesive layer. It does not teach a one step molding and metallization and it uses a heavy foil.

U.S. Pat. No. 3,424,635 is a method for making a composite plate. It does not utilize a transfer film. Metal is sprayed and electroplated, not vapor deposited as may be done in the present invention; therefore, the present invention can deposit a thinner layer. This patent requires the use of an adhesive layer to which the metal adheres.

U.S. Pat. No. 3,589,962 is a process for metallizing fabric. It is not a one step molding and metallization. It uses an adhesive layer.

U.S. Pat. No. 3,654,016 is not able to cover compoundly curved surfaces. It is not a one step molding and metallization. It is a method for heat-ironing a metal foil onto a surface.

U.S. Pat. No. 3,660,190 is a method for metallizing a film or foil using an intermediate adhesive layer. It utilizes a cylindrical roller. It cannot be used for compoundly curved surfaces. No molding is occurring.

U.S. Pat. No. 4,029,845 is a method for coating a preimpregnated surface with a nitrile rubber. Aluminum foil is used as the release. There is no transfer of metallization.

U.S. Pat. No. 4,030,953 is a method for placing a metal screen inside an antenna. It is not a transfer process as in the present invention. The layer of the metal screen is thicker and therefore heavier than the metal used in the present invention.

U.S. Pat. No. 4,067,950 shows the molding of a typical part which can be metallized by the present invention. It does not show a process for metallizing.

SUMMARY OF THE INVENTION

The present invention is a method for simultaneously, or in two steps, molding a composite material part such as a satellite antenna structure and metallizing a thin layer of metal onto said part. The part to be coated can be arbitrarily large and can have an arbitrary shape.

A thin metallic film is first laid onto a stretchable plastic or other release layer by, for example, a vapor deposition process. The release layer is fabricated of a material which provides structural support for the metal but doesn't adhere very well to it. It is much easier to coat the release layer in this fashion than to coat the object to be metallized with a vapor deposition process, because often the object to be metallized is large and thus the vapor vacuum chamber would have to be commensurately large. The metallized release layer can be spliced or bonded together so as to be usable in metallizing an arbitrarily large object.

The metallized release layer is then stretched over the object to be metallized or over the mold for same. During simultaneous molding and curing, excess adhesive from the composite object creates a bond between the metallized layer and the object. After curing, the release layer is peeled away, leaving a thin metal surface on the object.

In a second embodiment, the object is molded first and then the metallization is applied in a second step; in this case, to avoid the necessity for the application of additional adhesive onto the object prior to metallization, either a thermoplastic adhesive is used for the adhesive component of the composite, or else B-staged thermosetting adhesive is used wherein the molding does not constitute a final cure of same.

In a third embodiment, the object is first metallized and then molded in a second step. For this embodiment, either a thermoplastic adhesive is used or else a B-staged thermosetting adhesive is used wherein the metallization does not constitute a final cure of same.

In contrast to bonding a metal foil to the composite object, the present invention saves weight by applying a much thinner layer of metal. It is capable of fitting a larger variety of shapes since the plastic backing is more stretchable than foil.

In contrast to bonding a metallized film to the composite object, the present invention bonds only the metal layer of a metallized film to the object. This saves weight and eliminates the effect of thermal expansion of the film in the metallized object.

In contrast to vapor depositing metal directly onto a cured composite object, the present invention utilizes a reliable adhesive bond rather than a vapor deposition bond. It eliminates the need for a large expensive vapor deposition facility because the depositing of the metal onto the release film can be accomplished with a small facility and then several films spliced or bonded together. There is no limit to the size of the object to be metallized.

BRIEF DESCRIPTION OF THE DRAWINGS

These and other more detailed and specific objects and features of the present invention are more fully disclosed in the following specification, reference being had to the accompanying drawings, in which.

DESCRIPTION OF THE PREFERRED EMBODIMENTS

The object to be metallized is an arbitrarily large, arbitrarily shaped object fabricated of a composite material such as fiberglass-epoxy or graphite epoxy. One of the components of the composite is a set of high modulus fibers and another of the components is an adhesive. The adhesive is a thermoplastic, such as an acrylic or polyethylene, or a B-staged thermosetting adhesive, i.e., an adhesive which cures in stages such as epoxy or polyimide.

The metal which one wishes to coat onto the object is typically aluminum, copper, or silver. Aluminum is a good choice for coating satellite parts because it is a good conductor, does not corrode easily, and is relatively inexpensive. The required metallic thickness for microwave reflection off a satellite is frequently less than 0.0002 inches; the present invention is capable of coating such a thin layer onto the satellite.

The release layer or film is preferably stretchable (i.e., it should be stretchable enough to cover any curvature of the object to be metallized) and is some material which provides physical support for the metal but does not adhere as well to the metal as the metal adheres to the adhesive from the composite material. Thus, the release layer is typically Teflon (TM), Mylar (TM), or polyester. Teflon (TM) or another fluorocarbon based polymer is a particularily good choice because of its superior release characteristics and stretchability; however, other materials can be used for the backup layer, even including metal foil.

The metal is deposited onto the film by one of several possible techniques, such as vapor deposition, electrodeposition, spray coating, sputtering, or electroless chemical deposition. In any event, it is easier to coat the release layer in this way than it is to coat the object to be metallized, because techniques of mass production can be employed. For example, the film can be continuously wound on spools and can be arbitrarily small. Then the film can be spliced or bonded or otherwise joined together to sufficient size to cover the object to be metallized.

The molding of the object to its desired shape is preferably accomplished in the same step with its metallization. This process involves a mold, either vacuum or pressure, and may include heat. During this process the metal adheres to the surface of the object to be metallized. After molding, the release layer is peeled away from the metal, leaving the required thin layer of metal on the object.

Alternatively, the object could be molded in a first step and then metallized in a second step; or metallized in a first step and then molded in a second step as described above.

During metallization of the composite object, there may or may not be cross-linking or curing of the adhesive.

EXAMPLES

Figure 1:
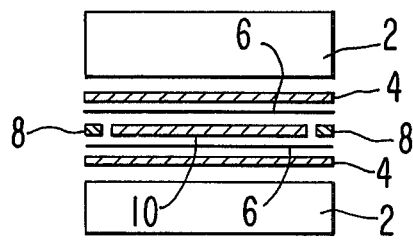
FIG. 1 illustrates an apparatus for curing and metallizing a wave filter iris using the present invention.

FIG. 1 illustrates the curing and metallizing in the same step of a wave filter iris. Several plies of graphite epoxy prepreg 10 are sandwiched between upper and lower sheets 6 of aluminized Teflon (TM) with the aluminum facing towards the prepreg. Shims 8 are used for maintaining the shape of the prepreg, which becomes the iris once cured and metallized. Aluminum plates 4 are placed on opposite sides of the aluminized Teflon (TM) to act as release plates between press platens 2, which are used to provide an elevated pressure as well as heat. In this case the pressure used is 60 tons, at 350° C. for 180 minutes. This effects simultaneous curing and metallization. Then the Teflon (TM) is peeled off the finished iris.

Figure 2:
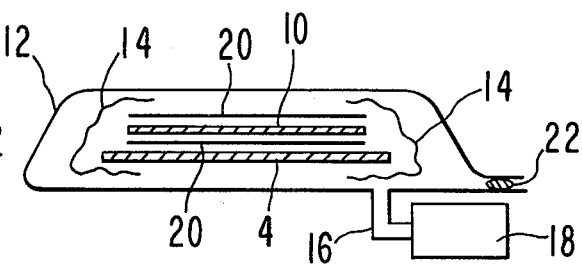
FIG. 2 is an illustration of the silverization of a graphite epoxy laminate using the present invention.

FIG. 2 illustrates the silverization of a graphite epoxy laminate. Several plies of semi-cured graphite epoxy 10 are sandwiched between layers 20 of silverized Teflon (TM) with the silver facing towards the laminate. An aluminum plate 4 is used for mechanically supporting this sandwich. A fiberglass cloth 14 is wrapped around these items to facilitate evacuation of a vacuum; wrapped around this is a flexable, e.g., nylon, vacuum bag 12. The entire assemblage is placed inside an autoclave (not shown). Vacuum pump 18 is used to evacuate vacuum bag 12 via tube 16 to a vacuum of about 15 PSI. Sealant 22 is used to insure that no gas leaks occur. The autoclave is pressurized so that there is 50 PSI pressure within it. Curing at a temperature of approximately 350° F. for 180 minutes results in the silverization of the graphite epoxy laminate. After cooling down, the Teflon (TM) is removed from the laminate.

Figure 3:
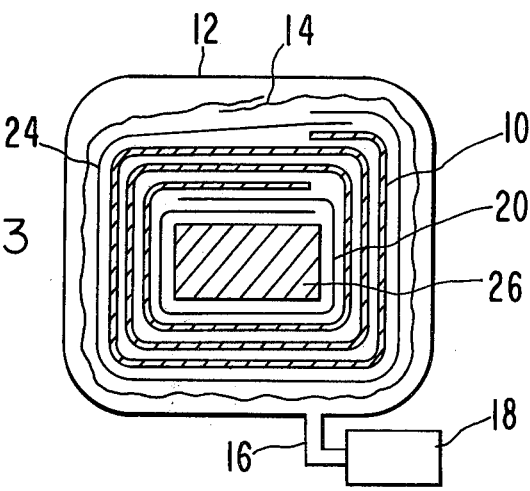
FIG. 3 illustrates the silverization of a graphite epoxy waveguide using the present invention.

FIG. 3 shows the silverization and simultaneous molding of a graphite epoxy waveguide. Steel tool 26 is used as a molding means to provide for the shape of the waveguide. Silverized Teflon (TM) film 20 is wrapped around the steel tool with the silver facing outside. Wrapped around this are several layers of woven graphite epoxy prepreg 10, which will become the waveguide. Wrapped around this is a layer of mold released heat shrinkable tape 24 for purposes of adding pressure and maintaining a smooth outer surface. Wrapped around this is a layer of fiber glass cloth 14 used to soak up excess resin. These items are placed inside a flexible vacuum bag 12 and the entire assemblage is placed inside an autoclave (not shown) which is pressurized to 50 PSI. Vacuum pump 18 creates a vacuum within the vacuum bag 12 via tube 16. At a vacuum of about 15 PSI and a temperature of about 350° F. for about 180 minutes, the waveguide is simultaneously cured and metallized. After cooling, the Teflon (TM) is stripped away from the metallized waveguide.

Figure 4:
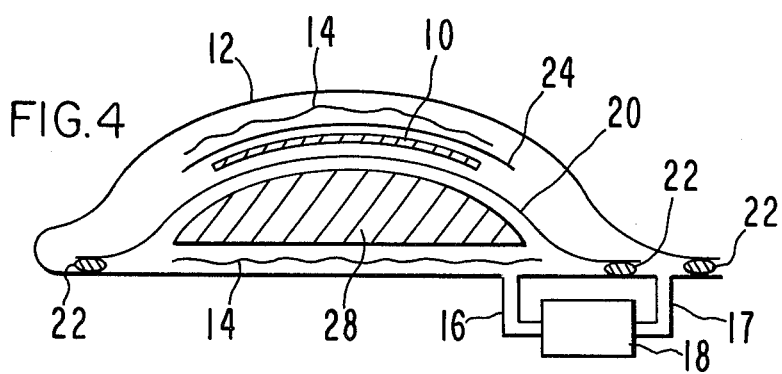
FIG. 4 illustrates the coating of a paraboloidal microwave reflector dish utilizing the present invention.

FIG. 4 shows the silverization of a paraboloidal microwave reflector dish antenna. Graphite tool 28 is used as a mold for shaping the antenna. A layer of silverized Teflon (TM) 20 is spread over the graphite tool with the silver side up. Then a woven graphite epoxy prepreg 10, which will become the antenna, is spread over this. On top of this is spread a release material 24. Fiber glass cloth 14 is placed around this assembly to facilitate evacuation of the vacuum. These items are placed inside a flexible vacuum bag 12, and all of this is then placed inside an autoclave (not depicted). Sealants 22 are used to facilitate evacuation of the vacuum bag 12 by vacuum pump 18 via tubes 16 and 17. At a pressure of 15 PSI vacuum, 50 PSI autoclave, and a temperature of 350° F. for about 180 minutes, the antenna is simultaneously molded and silverized. After cooling, the Teflon (TM) and release material 24 are stripped off the metallized antenna.

In the examples depicted in FIGS. 2, 3, and 4, an oven could be used in lieu of the autoclave. This results in heat and a vacuum but no autoclave pressure.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention. For example, if a pressure sensitive adhesive or a room temperature curing adhesive were used, no heat would be necessary to achieve the metallization.

What is claimed is:

1. Method for applying a metal coating onto a composite object having a compoundly curved shape and having a high modulus fiber component and an adhesive component, wherein the adhesive component is from the class consisting essentially of thermoplastic adhesives and B-staged thermosetting adhesives; said method comprising the steps of:
depositing by vapor deposition a thin layer of said metal less than 0.0002 inches thick onto a fluorocarbon-based polymer release film to form a metallized film;
joining together several of said metallized films side-by-side to provide a single large metallized film having a sufficient size to cover said object;
placing said large metallized film against the composite object, with the metal side facing the composite object, in such a way that no additional adhesive agent is placed between said metal and said object;
in a vacuum formed by a single vacuum source, adhering said metal to said object while simultaneously applying pressure to said object and to said large metallized film so that said object is molded into said compoundly curved shape and coated with said large metallized film in same step; and
peeling said release film away from said metallized composite object leaving just said metal coating on said composite object.

* * * * *